United States Patent
Naka et al.

(12)

(10) Patent No.: US 6,661,274 B1
(45) Date of Patent: Dec. 9, 2003

(54) LEVEL CONVERTER CIRCUIT

(75) Inventors: Naoaki Naka, Kawasaki (JP); Junko Nakamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/698,244

(22) Filed: Oct. 30, 2000

(30) Foreign Application Priority Data

Mar. 1, 2000 (JP) ........................................ 2000-055592

(51) Int. Cl.[7] ................................................. H03L 5/00
(52) U.S. Cl. ........................ 327/333; 327/103; 327/112; 326/81
(58) Field of Search ................................. 327/333, 143, 327/383, 112, 103, 171, 374, 387; 326/80, 81, 62, 63

(56) References Cited

U.S. PATENT DOCUMENTS

| | | | | |
|---|---|---|---|---|
| 5,900,752 A | * | 5/1999 | Mar ............................ | 327/143 |
| 6,242,949 B1 | * | 6/2001 | Wilford ........................ | 326/81 |
| 6,255,888 B1 | * | 7/2001 | Satomi ......................... | 327/333 |
| 6,501,306 B1 | * | 12/2002 | Kim et al. ................... | 327/112 |

* cited by examiner

Primary Examiner—Tuan T. Lam
Assistant Examiner—Hiep Nguyen
(74) Attorney, Agent, or Firm—Arent Fox Kintner Plotkin & Kahn, PLLC

(57) ABSTRACT

In the level converter circuit, when input signal is L level, a first NMOS transistor and a first PMOS transistor P1 are turned on by a first power supply potential, a second power supply potential is output to a first output terminal, a second NMOS transistor is turned on, and thereby, a reference potential VSS is output to a second output terminal. On the other hand, when the input signal is H level, a third NMOS transistor is turned on, the reference potential is output to the first output terminal, a fourth NMOS transistor and a second PMOS transistor are turned on, and thereby, the first power supply potential VDH is output to the second output terminal.

10 Claims, 9 Drawing Sheets

LEVEL CONVERTER CIRCUIT

FIELD OF THE INVENTION

The present invention relates to a level converter circuit, and in particular, to a differential signal output level converter circuit which outputs a differential signal.

BACKGROUND OF THE INVENTION

In recent years, the process technology is progressing, and thereby, there are many cases where different potential signals must be handled, or a differential signal is used in order to propagate a high speed signal. For this reason, a differential signal output circuit and a level converter circuit are both required. However, if these circuits are included then the circuit scale increases. When many circuits are operated in synchronous with one clock signal, it is desirable that a skew between these circuits is small as much as possible. In order to make small the skew, a circuit scale needs to be made small as much as possible so as to make small a propagation delay time of the circuit itself.

Figure 1:
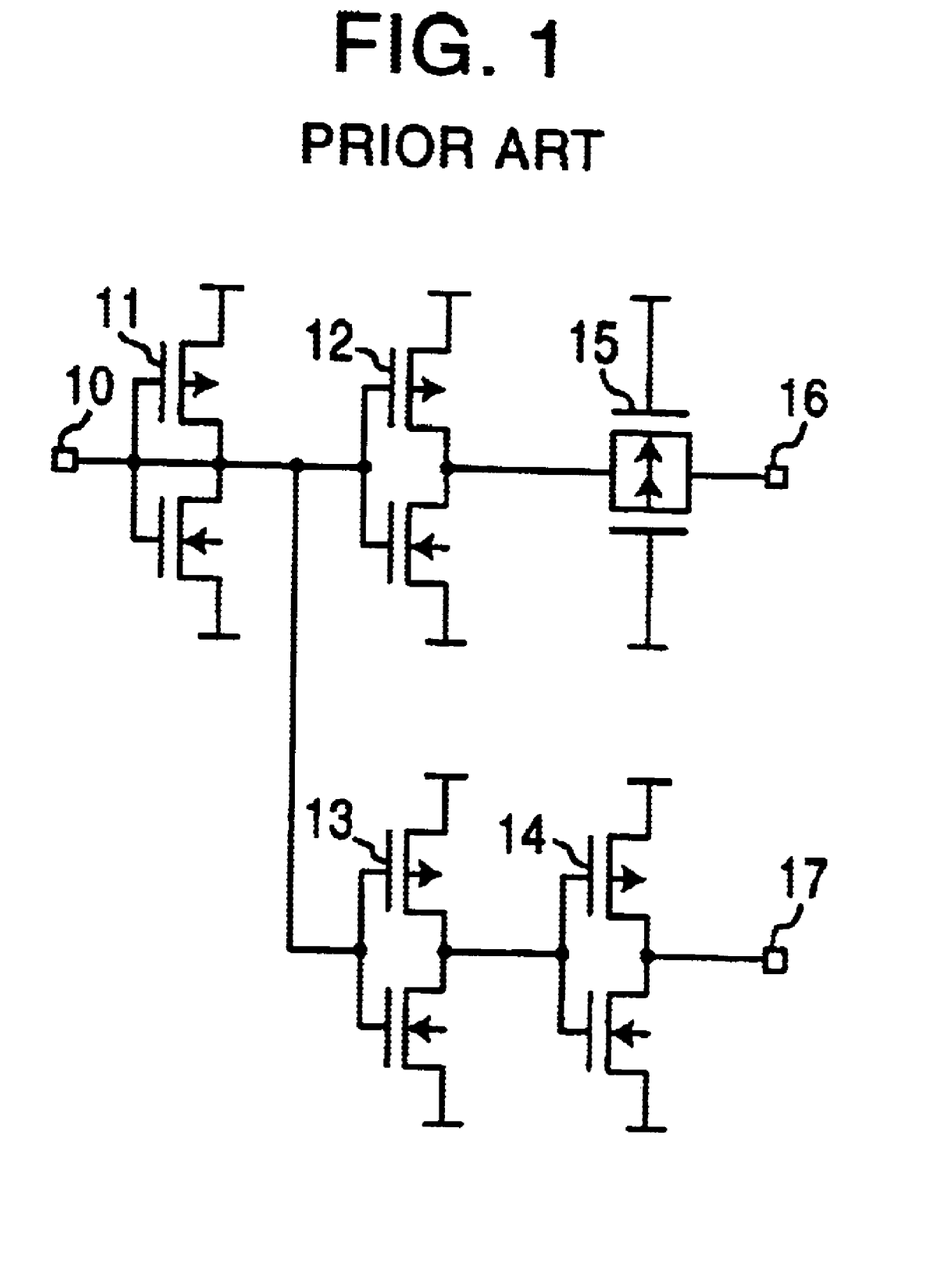
FIG. 1 is a circuit diagram showing a construction of a conventional differential signal output circuit.

FIG. 1 is a circuit diagram showing a construction of a conventional differential signal output circuit comprising a CMOS circuit. This differential signal output circuit comprises four inverters 11, 12, 13 and 14, and a through circuit 15.

The first inverter 11 uses a signal from an input terminal 10 as an input signal. A signal outputted from the first inverter 11 is input into the second inverter 12 and the third inverter 13. An output signal of the second inverter 12 is output to a first output terminal 16 via the through circuit 15. A signal output from the third inverter 13 is input into the fourth inverter 14. An output signal of the fourth inverter 14 is output to a second output terminal 17.

When the potential level of the input signal is relatively low (hereinafter, referred to as L level), output potential of the first inverter 11 becomes a relatively high potential level (hereinafter, referred to as H level). The output potentials of the second inverter 12 and the third inverter 13 both become L level. Moreover, potential level of the fourth inverter 14 becomes H level. Thus, the output potential level of the first output terminal 16 and the output potential level of the second output terminal 17 become L level and H level, respectively. On the other hand, when the input signal is H level, the output potential levels become reverse to the above case. Accordingly, the signal goes through a three-stage logical element or transistor from the input terminal 10 to the output terminals 16 and 17.

Figure 2:
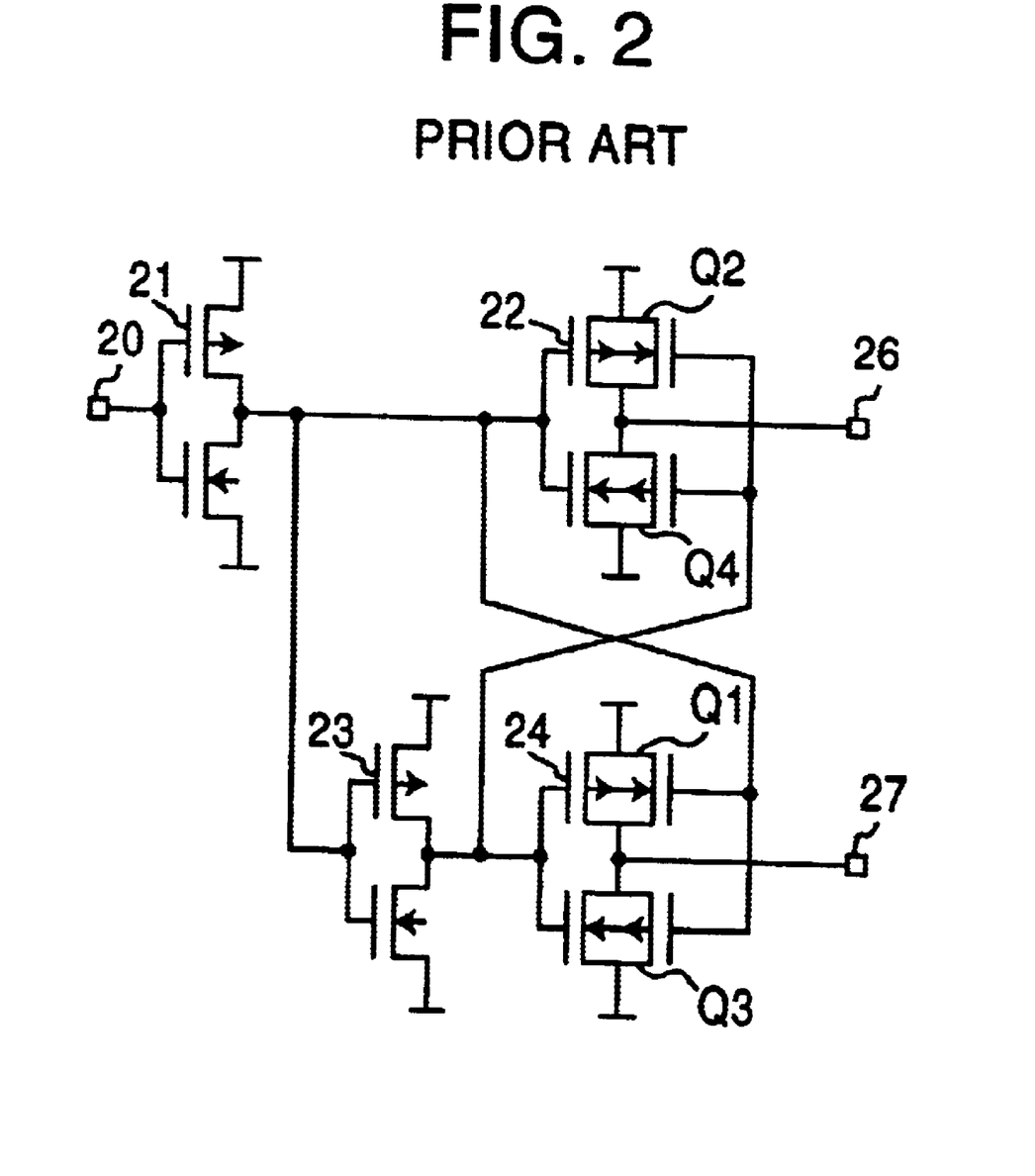
FIG. 2 is a circuit diagram showing another construction of the conventional differential signal output circuit.

FIG. 2 is a circuit diagram showing another construction of the conventional differential signal output circuit comprising a CMOS circuit. This differential signal output circuit comprises four inverters 21, 22, 23 and 24, two N-channel MOS transistors (hereinafter, referred to as NMOS transistor) Q1 and Q2, and two P-channel MOS transistors (hereinafter, referred to as PMOS transistor) Q3 and Q4.

Input signal is input into the first inverter 21 via an input terminal 20. A signal output from the first inverter 21 is input into the second inverter 22 and the third inverter 23, and also input into the gates of source follower type second NMOS transistor Q2 and second PMOS transistor Q4. The source of the second NMOS transistor Q2 and that of the second PMOS transistor Q4 are connected to a first output terminal 26 together with an output terminal of the second inverter 22.

A signal output from the third inverter 23 is input into the fourth inverter 24, and also input into the gates of source follower type first NMOS transistor Q1 and first PMOS transistor Q3. The sources of the first NMOS transistor Q1 and the first PMOS transistor Q3 are connected to a second output terminal 27 together with an output terminal of the fourth inverter 24.

When the input signal is L level, output potential of the first inverter 21 becomes H level. Therefore, output potential of the second inverter 22 becomes L level, and thus, L level signal is output to the first output terminal 26. Moreover, the NMOS transistor Q1 is turned on, and thereby, the potential level of the second output terminal 27 becomes H level. On the other hand, when the input signal is H level, the output potential of the first inverter 21 becomes L level. The output level is inverted by the second inverter 22; therefore, the potential level of the first output terminal 26 becomes H level. Moreover, the PMOS transistor Q3 is turned on, and thereby, the potential level of the second output terminal 27 becomes L level. Accordingly, the signal goes through a two-stage logical element or transistor from the input terminal 20 to the output terminals 26 and 27.

Figure 3:
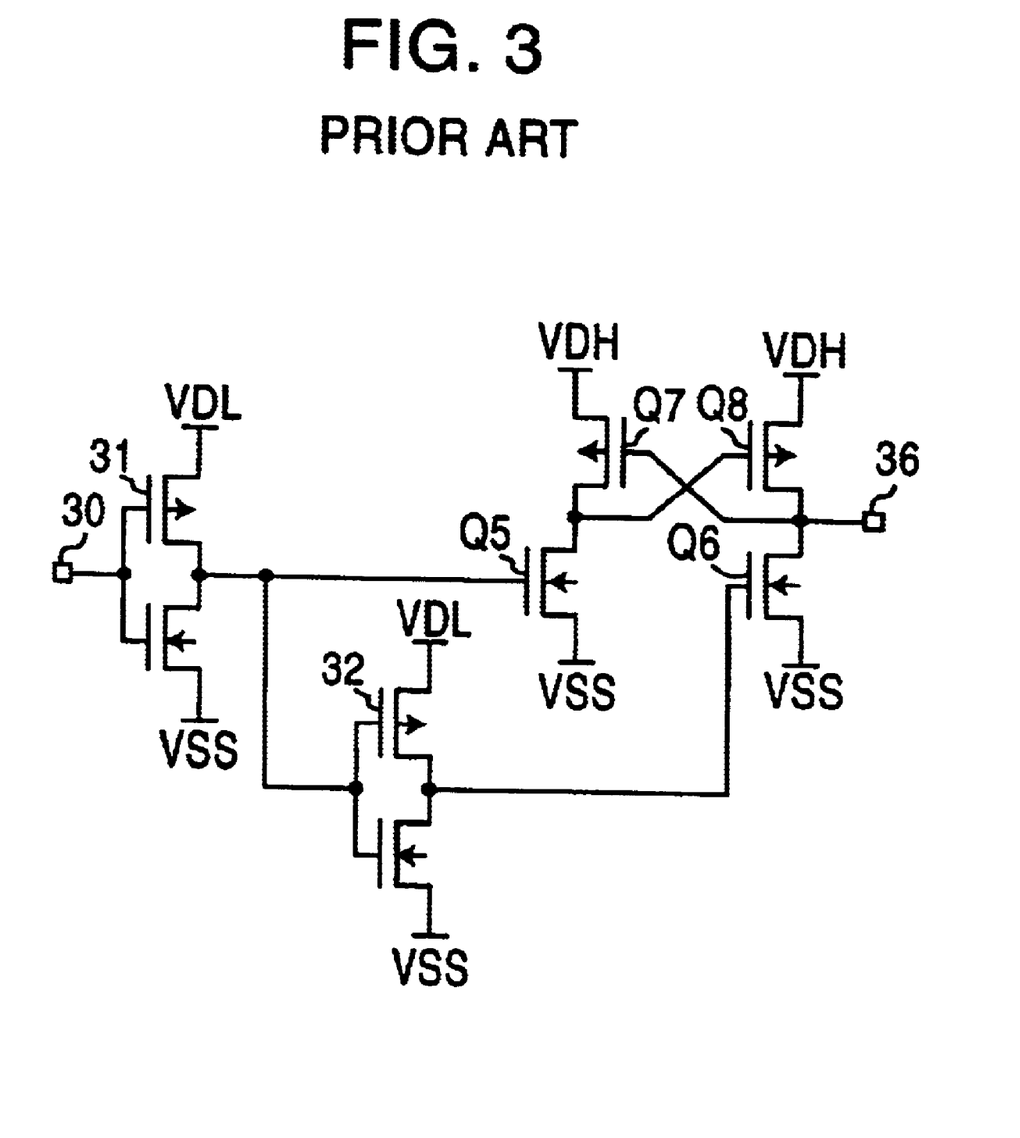
FIG. 3 is a circuit diagram showing a construction of a conventional level converter circuit.

FIG. 3 is a circuit diagram showing a construction of a conventional level converter circuit comprising a CMOS circuit. This level converter circuit comprises two inverters 31 and 32, two NMOS transistors Q5 and Q6, and two PMOS transistors Q7 and Q8.

Input signal is input into the first inverter 31 via an input terminal 30. A signal output from the first inverter 31 is input into the second inverter 32, and also input into the gate of the first NMOS transistor Q5. Moreover, a signal output from the second inverter 32 is input into the gate of the second NMOS transistor Q6. The inverters 31 and 32 both output either a reference potential VSS or a first power supply potential VDL.

Drain of the first NMOS transistor Q5 and drain of the first PMOS transistor Q7 are connected in common, and, drain common to the above both transistors is connected to the gate of the second PMOS transistor Q8. Moreover, drain of the second PMOS transistor Q8 and drain of the second NMOS transistor Q6 are connected in common, and, drain common to the above both transistors is connected to the gate of the first PMOS transistor Q7, and further, is connected to the output terminal 36. Source potential of NMOS transistor Q5 and Q6 is reference potential VSS. And source potential of PMOS transistor Q7 and Q8 is second power supply potential VDH.

When the input signal is L level, output potential of the first inverter 31 becomes H level. Therefore, the NMOS transistor Q5 is turned on, and thereby, the second PMOS transistor Q8 is turned on. Accordingly, H level signal is input into the output terminal 36. On the other hand, where an input signal is H level, the output potential of the first inverter 31 becomes L level; therefore, output potential of the second inverter 32 becomes H level. Whereby the second NMOS transistor Q6 is turned on; thus, L-level signal is output to the output terminal 36. Accordingly, the signal goes through a three-stage logical element or transistor from the input terminal 30 to the output terminal 32.

If the differential signal output circuit shown in FIG. 1 and the level converter circuit shown in FIG. 3 are combined, a signal goes through three-stages in the differential signal output circuit, and three-stages in the level converter circuit. That is, the signal goes through six-stages of logical element or transistor in total from the input terminal 10 to the output terminal 36. On the other hand, if the differential signal output circuit shown in FIG. 2 and the level converter circuit shown in FIG. 3 are combined, a signal goes through two-stages in the differential signal output circuit, and three-stages in the level converter circuit. That is, the signal goes through five-stages of logical element or transistor in total from the input terminal 20 to the output terminal 36.

In order to make the propagation delay time of the circuit small, and also to make the skew between a plurality of circuits small as much as possible, it is desirable to reduce the number of stages of logical element or transistor through which a signal goes in the differential signal output circuit and the level converter circuit.

SUMMARY OF THE INVENTION

It is an object of the present invention to provide a level converter circuit which has both functions of the differential signal output circuit and the level converter, and reduces the number of stages of logical element or transistor through which a signal goes.

The level converter circuit of the present invention has the following features. When an input signal of L level is input, the level converter circuit is provided with a logical element which outputs a first power supply potential VDL, and then, a first N-channel field effect transistor is driven by an output of the logical element. Then, a first P-channel field effect transistor is driven by an output of the first N-channel filed effect transistor so that a second power supply potential VDH is outputted to a first output terminal. Moreover, a second N-channel field effect transistor is driven by the output of the logical element so that a reference potential VSS is outputted to a second output terminal.

When an input signal of H level is input, the reference potential VSS is output from the logical element, and then, its potential level is inverted so as to become a first power supply potential VDL. Further, a third N-channel field effect transistor is driven by the first power supply potential VDL so that a reference potential VSS is outputted to the first output terminal. Moreover, a fourth N-channel field effect transistor is driven by an inverted potential of the output of the logical element, and further, a second P-channel field effect transistor is driven by the output of the fourth N-channel field effect transistor so that the first power supply potential VDH is outputted to the second output terminal.

According to the present invention, the number of stages of logical element or transistor in a signal propagation path from the input terminal to the output terminals of the differential signal output level converter circuit is two or three when the input signal is L level, and three or four when the input signal is H level.

Other objects and features of this invention will become apparent from the following description with reference to the accompanying drawings.

DESCRIPTION OF THE PREFERRED EMBODIMENTS

Three preferred embodiments of the differential signal output level converter circuit according to this invention will be described below with reference to the accompanying drawings.

Figure 4:
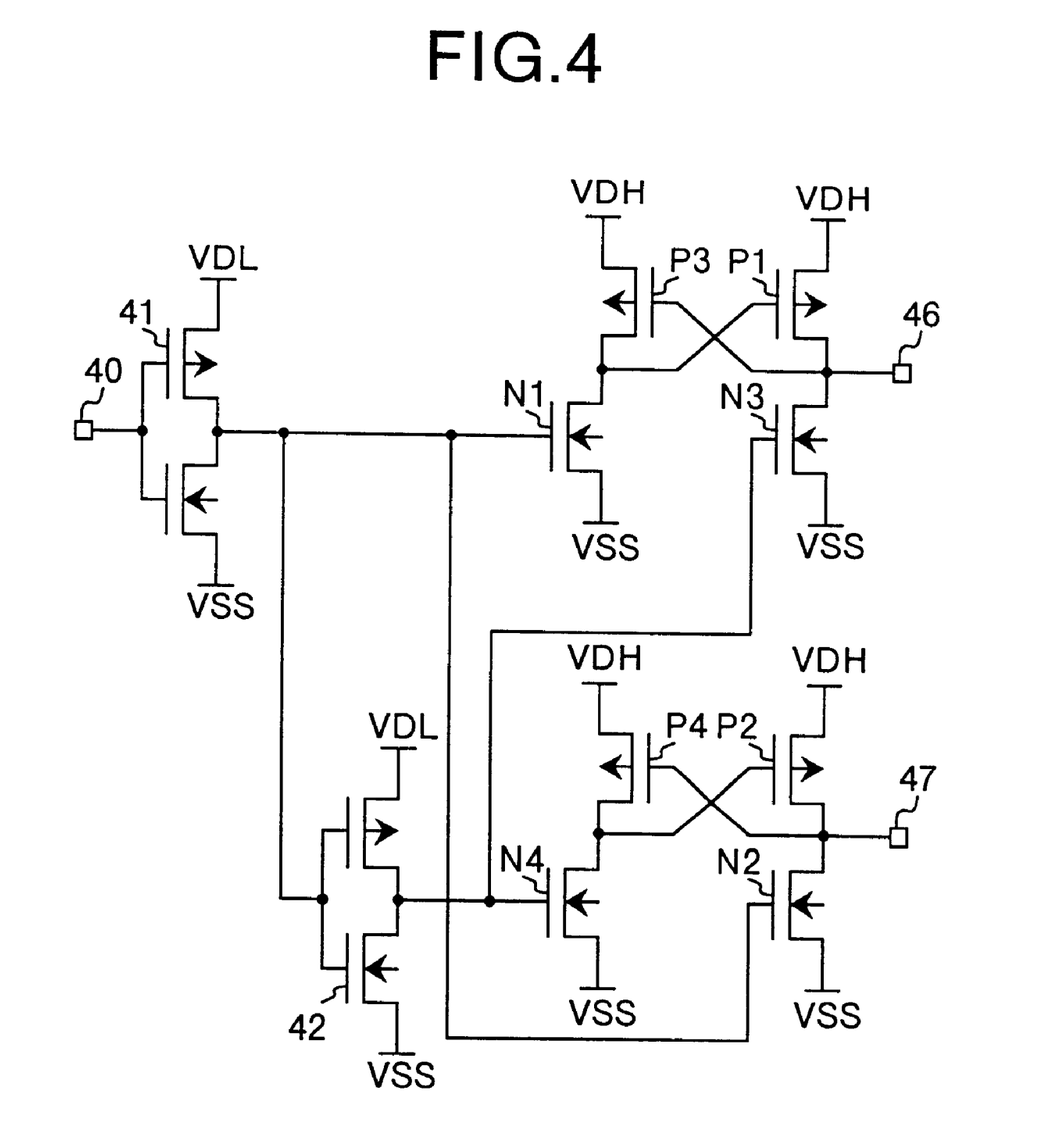
FIG. 4 is a circuit diagram showing a differential signal output level converter circuit according to a first embodiment of the present invention.

FIG. 4 is a circuit diagram showing a differential signal output level converter circuit according to a first embodiment of the present invention. This differential signal output level converter circuit comprises two inverters 41 and 42, four NMOS transistors N1, N2, N3 and N4, and four PMOS transistors P1, P2, P3 and P4.

The first inverter 41 has an input terminal connected to the input terminal 40 of the whole of the differential signal output level converter circuit, and outputs either a reference potential VSS or a first power supply potential VDL in accordance with an input signal. Namely, the first inverter 41 is equivalent to a logical element connected to the input terminal 40. An output terminal of the first inverter 41 is connected to the gate of the first NMOS transistor N1.

A source potential of the first NMOS transistor N1 is a reference potential VSS. The drain of the first NMOS transistor N1 is connected to the drain of the third PMOS transistor P3 and the gate of the first PMOS transistor P1. Each source potential of the first PMOS transistor P1 and the third PMOS transistor P3 is a second power supply potential VDH.

Gate of the third PMOS transistor P3 is connected in common to the drain of the first PMOS transistor P1 and the drain of the third NMOS transistor N3, and also connected to a first output terminal 46. A source potential of the third NMOS transistor N3 is a reference potential VSS. The gate of the third NMOS transistor N3 is connected to an output terminal of the second inverter 42.

Moreover, the output terminal of the first inverter 41 is connected to an input terminal of the second inverter 42. The second inverter 42 outputs either a reference potential VSS or a first power supply potential VDL in accordance with an output potential level of the first inverter 41. The output terminal of the second inverter 42 is connected to the gate of the fourth NMOS transistor N4.

A source potential of the fourth NMOS transistor N4 is a reference potential VSS. Drain of the fourth NMOS transistor N4 is connected to drain of the fourth PMOS transistor P4 and the gate of the second PMOS transistor P2. Each source potential of the second PMOS transistor P2 and the fourth PMOS transistor P4 is a second power supply potential VDH.

Gate of the fourth PMOS transistor P4 is connected in common to the drain of the second PMOS transistor P2 and the drain of the second NMOS transistor N2, and also to a second output terminal 47. A source potential of the second NMOS transistor N2 is a reference potential VSS. Gate of the second NMOS transistor N2 is connected to the output terminal of the second inverter 41.

Next, operation of the differential signal output level converter circuit according to this first embodiment will be explained. when the potential level of input signal is L level, each output potential level of the first inverter 41 and the second inverter 42 becomes the first power supply potential VDL and a reference potential VSS, respectively. Therefore, the first NMOS transistor N1 becomes on; as a result, potential level of the drain output of the NMOS transistor N1 becomes a reference potential VSS.

Thus, the first PMOS transistor P1 becomes on, and then, potential level of the first output terminal becomes a second power supply potential VDH. In this case, the third PMOS transistor P3 and the third NMOS transistor N3 both becomes off, and thereby, it is possible to prevent a flow-through current from flowing between an applied terminal of the second power supply potential VDH and an applied terminal of the reference potential VSS.

Moreover, the second NMOS transistor N2 becomes on, and then, a potential level of the drain output, that is, a potential level of the second out terminal 47 becomes a reference potential VSS. In this case, the fourth PMOS transistor P4 becomes on, and thereby, the second PMOS transistor P2 becomes off. Further, the fourth NMOS transistor N4 also becomes off, and thereby, it is possible to prevent a flow-through current from flowing between an applied terminal of the second power supply potential VDH and an applied terminal of the reference potential VSS.

However, in this case, each threshold value of the first NMOS transistor N1 and the second NMOS transistor N2 exists in a range between the reference potential VSS and the first power supply potential VDL.

On the other hand, when the potential level of the input signal is H level, each output potential level of the first inverter 41 and the second inverter 42 becomes a reference potential VSS and the first power supply potential VDL respectively. Therefore, the third NMOS transistor N3 becomes on; as a result, a potential level of the drain output, that is, a potential level of the first output terminal 46 becomes a reference potential VSS. In this case, the third PMOS transistor P3 becomes on, and thereby, the first PMOS transistor P1 becomes off. Moreover, the first NMOS transistor N1 also becomes off, and thereby, it is possible to prevent a flow-through current from flowing between an applied terminal of the second power supply potential VDH and an applied terminal of the reference potential VSS.

Moreover, the fourth NMOS transistor N4 becomes on, and then, a potential level of the drain output becomes a reference potential VSS. Thus, the second PMOS transistor P2 becomes on, and thereby, a potential level of the second output terminal 47 becomes a second power supply potential VDH. In this case, the fourth PMOS transistor P4 and the second NMOS transistor N2 both becomes off, and thereby, it is possible to prevent a flow-through current from flowing between an applied terminal of the second power supply potential VDH and an applied terminal of the reference potential VSS.

However, in this case, each threshold value of the first NMOS transistor N1, the second NMOS transistor N2, the third NMOS transistor N3 and the fourth NMOS transistor N4 exists in a range between the reference potential VSS and the first power supply potential VDL. In the first inverter 41 and the second inverter 42, a flow-through current is prevented from flowing between an applied terminal of the first power supply potential VDL and an applied terminal of the reference potential VSS.

According to the first embodiment, the number of stages of logical element or transistor in a signal propagation path from the input terminal 40 to the output terminals 46 and 47 is two or three stages if the input signal is L, and is three or four stages if the input signal is H. Therefore, the number of stages is reduced as compared with the conventional case. As a result, circuit scale is reduced, and also, propagation delay time of the circuit itself becomes short. Moreover, the differential signal output level converter circuit has a simple construction as compared with the conventional circuit. Therefore, phase difference between differential signals becomes small. In addition, no flow-through current flows; therefore, it is possible to reduce a power consumption.

Accordingly, the differential signal output level converter circuit of this invention can be effectively applicable to an LSI high speed input-output circuit, as an interface between internal and external buses such as a server or exchanger, as an interface circuit between an optical device for optical communication and an LSI, etc.

Figure 5:
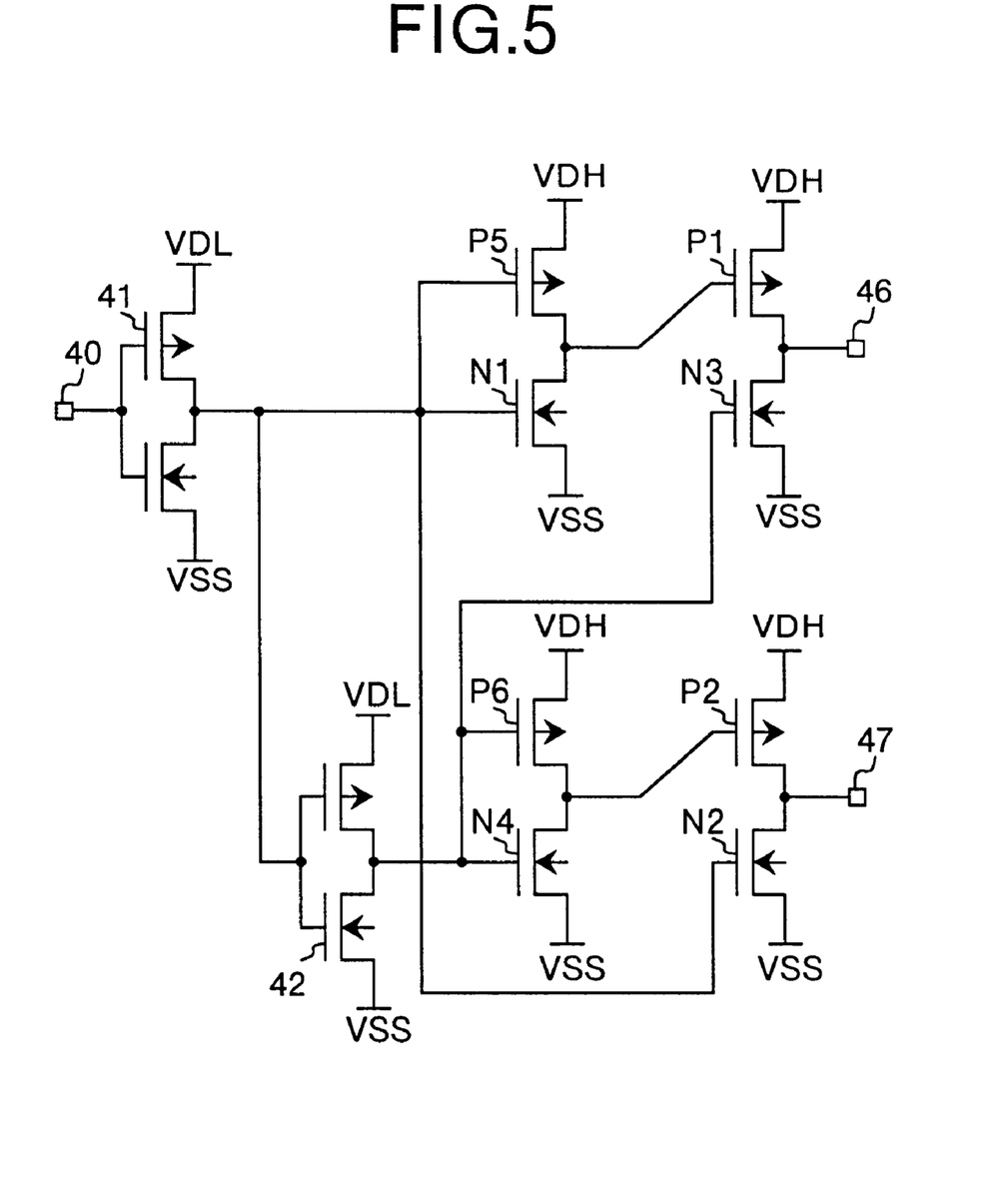
FIG. 5 is a circuit diagram showing a modification example of the first embodiment.

FIG. 5 shows a modification of the first embodiment. The differential signal output level converter circuit shown in FIG. 5 is different from the circuit shown in FIG. 4 in the following two points.
1) A fifth PMOS transistor P5 provided in place of the third PMOS transistor P3. In this fifth PMOS transistor P5, source potential is a second power supply potential VDH, and which has a gate and a drain connected to the gate and the drain of the first NMOS transistor N1, respectively.
2) A sixth PMOS transistor P6 is provided in place of the fourth PMOS transistor P4. In this sixth PMOS transistor P6, source potential is a second power supply potential VDH, and which has a gate and a drain connected to the gate and the drain of the fourth NMOS transistor N4, respectively. Preferably, the fifth PMOS transistor P5 and the sixth PMOS transistor P6 have a threshold value voltage such that a current does not flow so much unless they is turned on or even if they are turned on in the case where their potential are the first power supply potential VDL.

The circuit shown in FIG. 5 performs the same operation as the circuit shown in FIG. 4. However, in the differential signal output level converter circuit shown in FIG. 5, each output potential of the first output terminal 46 and the second output terminal 47 is not fed back to the pre-stage transistor. Therefore, operating speed becomes high speed as compared with the circuit shown in FIG. 4. Namely, the circuit shown in FIG. is effectively applicable to a higher speed device.

Figure 6:
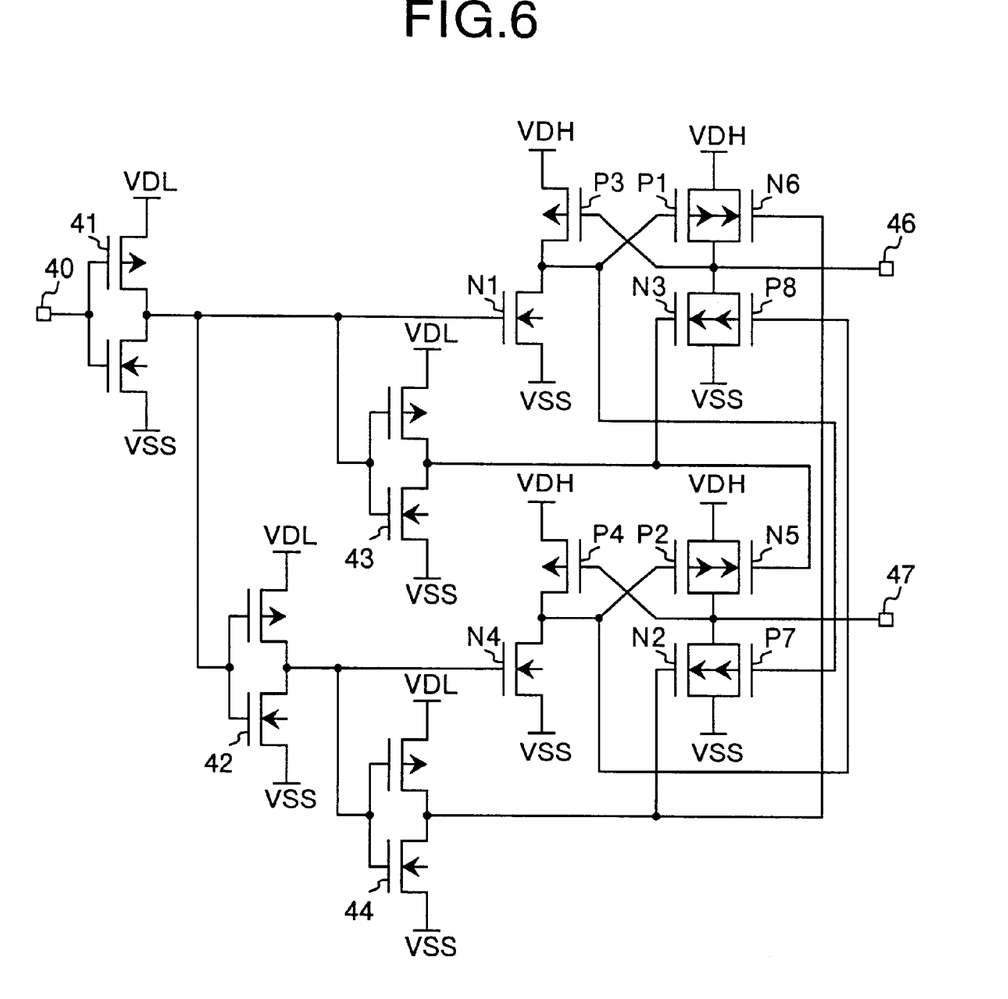
FIG. 6 is a circuit diagram showing a differential signal output level converter circuit according to a second embodiment of the present invention.

FIG. 6 is a circuit diagram showing a construction of a differential signal output level converter circuit according to a second embodiment of the present invention. This differential signal. output level converter circuit is different from the circuit shown in FIG. 4 in the following eight points.
1) A third inverter 43 is connected to the output terminal of the first inverter 41.
2) Aa fourth inverter 44 is connected to the output terminal of the second inverter 42. The third inverter 43 and fourth inverter 44 output a first power supply potential VDL or a reference potential VSS.
3) The gate terminal of the third NMOS transistor N3 is not connected to the output terminal of the second inverter 42, but is connected to an output terminal of the third inverter 43.
4) The gate terminal of the second NMOS transistor N2 is not connected to the output terminal of the first inverter 41, but is connected to an output terminal of the fourth inverter 44.
5) A fifth NMOS transistor N5 is provided whose drain potential is a second power supply potential VDH, and which has a gate terminal and a source terminal connected to the output terminal of the third inverter 43 and the second output terminal 47, respectively.

6) A sixth NMOS transistor N6 is provided whose drain potential is a second power supply potential VDH, and which has a gate terminal and a source terminal connected to the output terminal of the fourth inverter 44 and the first output terminal 46, respectively.

7) A seventh PMOS transistor P7 is provided whose drain potential is a reference potential VSS, and which has a gate terminal and a source terminal connected to the drain terminal of the first NMOS transistor N1 and the second output terminal 47, respectively.

8) An eighth PMOS transistor P8 is provided whose drain potential is a reference potential VSS, and which has a gate terminal and a source terminal connected to the drain terminal of the fifth NMOS transistor N4 and the first output terminal 46, respectively. Other construction is the same as the above first embodiment. Like legends are used to designate the same construction as the first embodiment and details are omitted in order to avoid an overlapping explanation.

Next, operation of the differential signal output level converter circuit according to the second embodiment will be explained. When the potential level of the input signal is L level, output potential level of the first inverter 41 becomes the first power supply potential VDL. Therefore, the first NMOS transistor becomes on, the potential level of its drain output becomes the reference potential VSS. Accordingly, the first PMOS transistor P1 becomes on, and the potential level of the first output terminal 46 becomes the second power supply potential VDH. Further, the seventh PMOS transistor P7 becomes on, therefore, the potential level of its source output, that is, the potential level of the second output terminal 47 becomes the reference potential VSS.

In this case, the third PMOS transistor P3 becomes off. Output potential level of the third inverter 43 becomes the reference potential VSS. Therefore, the third NMOS transistor N3 and the fifth NMOS transistor N5 both become off. Moreover, the fourth PMOS transistor P4 becomes on, and thereby, the second PMOS transistor P2 and the eighth PMOS transistor P8 become off. In addition, the fourth NMOS transistor N4 also becomes off. Whereby it is possible to prevent a flow-through current from flowing between an applied terminal of the second power supply potential VDH and an applied terminal of the reference potential VSS.

On the other hand, when the potential level of the input signal is H, each output potential level of the first inverter 41 and the third inverter 43 becomes the reference potential VSS and the first power supply potential VDL, respectively. Therefore, the third NMOS transistor N3 becomes on; as a result, a potential level of its drain output, that is, a potential level of the first output terminal 46 becomes the reference potential VSS. Moreover, the fifth NMOS transistor N5 also becomes on. Therefore, potential level of its source output, that is, a potential level of the second output terminal 47 becomes a second power supply potential VDH.

In this case, the third PMOS transistor P3 becomes on, and thereby, the first PMOS transistor P1 and the seventh PMOS transistor P7 become off. Further, the first NMOS transistor N1 becomes off. Furthermore, the fourth PMOS transistor P4 becomes off. Moreover, output potential of the fourth inverter 44 becomes the reference potential VSS. Therefore, the second NMOS transistor N2 and the sixth NMOS transistor N6 become off. Whereby it is possible to prevent a flow-through current from flowing between an applied terminal of the second power supply potential VDH and an applied terminal of the reference potential VSS.

However, in this case, a threshold value of the fifth NMOS transistor N5 exists in a range between the second power supply potential VDH and the first power supply potential VDL. In the third inverter 43 and the fourth inverter 44, a flow-through current is prevented from flowing between an applied terminal of the first power supply potential VDL and an applied terminal of the reference potential VSS.

According to the second embodiment, the number of stages of logical element or transistor in a signal propagation path from the input terminal 40 to the output terminals 46 and 47 is three in either case of the input signal being L or H level. Therefore, the number of stages is reduced as compared with the conventional case. As a result, the circuit scale is reduced, and also, propagation delay time of the circuit itself becomes short. Moreover, the differential signal output level converter circuit has a simple construction as compared with the conventional circuit. Therefore, the phase difference between differential signals becomes small. In addition, no flow-through current flows; therefore, it is possible to reduce a power consumption.

Accordingly, the differential signal output level converter circuit of the second embodiment is effectively applicable to an LSI high speed input-output circuit, as an interface between internal and external buses such as a server or exchanger, as an interface circuit between an optical device for optical communication and an LSI, etc.

Figure 7:
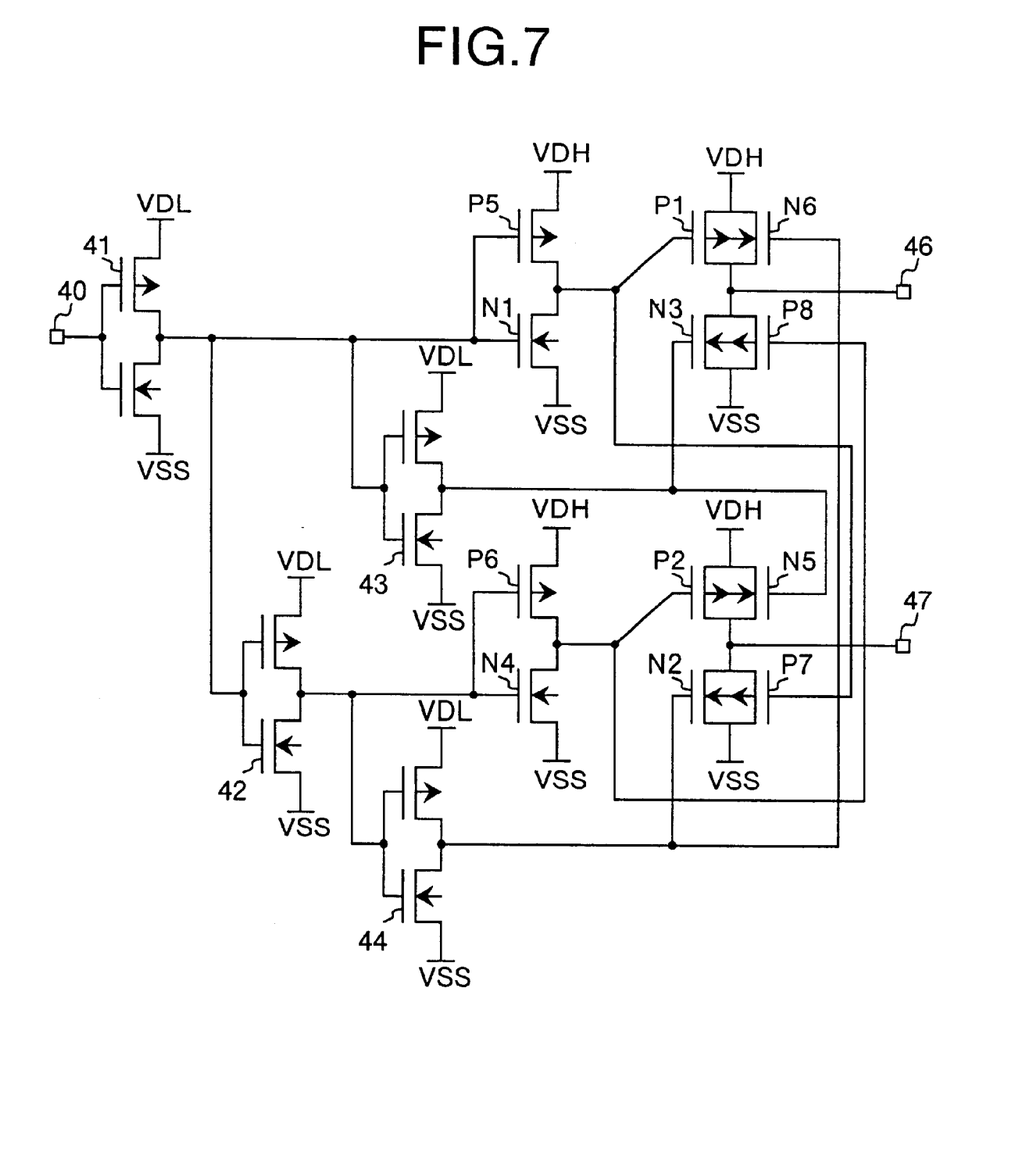
FIG. 7 is a circuit diagram showing an modification example of the second embodiment.

FIG. 7 shows a modification of the second embodiment. The relation between a differential signal output level converter circuit shown in FIG. 7 and the circuit shown in FIG. 6 is the same as the relation between the circuit of modification example shown in FIG. 5 and the circuit shown in FIG. 4 in the above first embodiment. More specifically, in place of the third PMOS transistor P3 and the fourth PMOS transistor P4, the circuit is provided with a fifth PMOS transistor P5 and a sixth PMOS transistor P6.

The circuit shown in FIG. 7 performs the same operation as the circuit shown in FIG. 6. However, in the differential signal output level converter circuit shown in FIG. 7, each output potential of the first output terminal 46 and the second output terminal 47 is not fed back to the pre-stage transistor. Therefore, operating speed becomes high as compared with the circuit shown in FIG. 6. Namely, the circuit shown in FIG. 7 is effectively applicable to a higher speed device.

Figure 8:
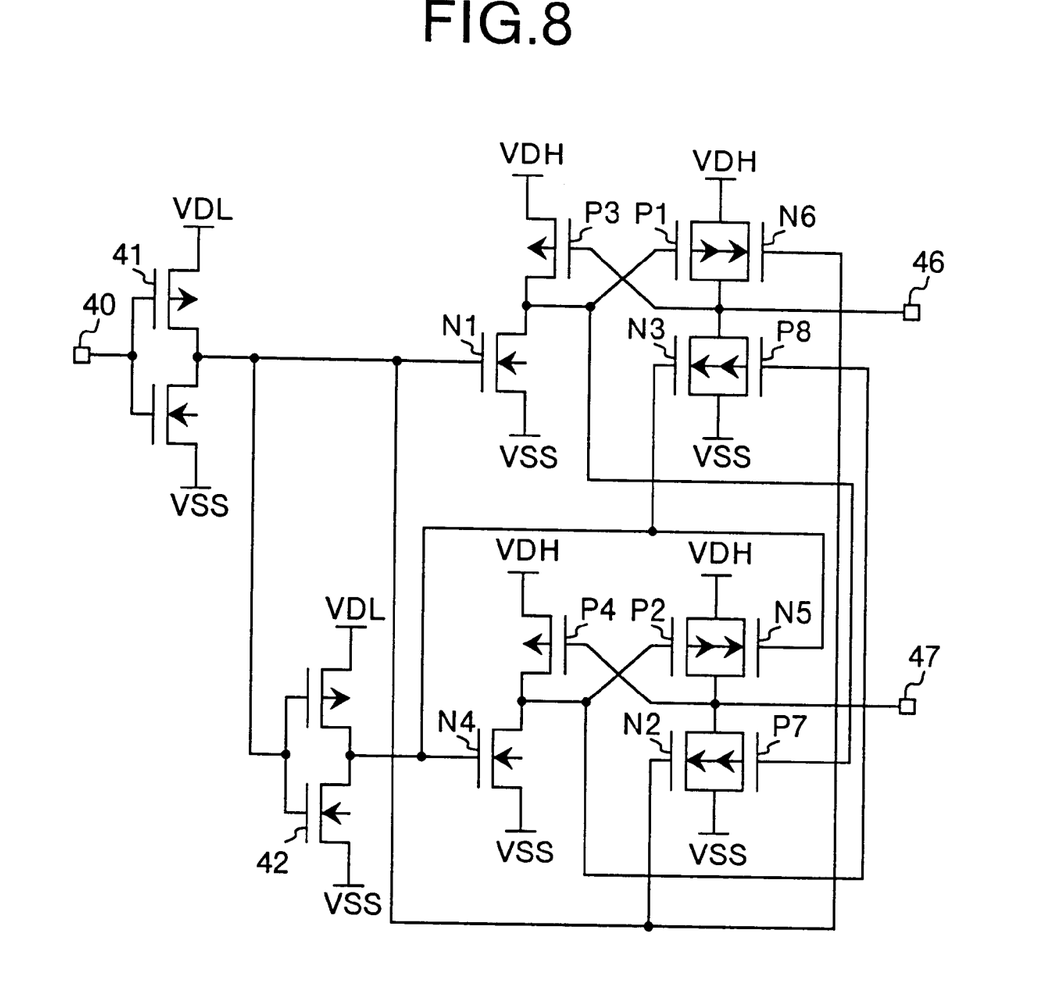
FIG. 8 is a circuit diagram showing a differential signal output level converter circuit according to a third embodiment of the present invention.

FIG. 8 is a circuit diagram showing a construction of a differential signal output level converter circuit according to a third embodiment of the present invention. This differential signal output level converter circuit is different from the circuit shown in FIG. 4 in the following four points.

1) A fifth NMOS transistor N5 is provided whose drain potential is a second power supply potential VDH, and which has a gate and a source connected to the output terminal of the second inverter 42 and the second output terminal 47, respectively.

2) A sixth NMOS transistor N6 is provided whose drain potential is a second power supply potential VDH, and which has a gate and a source connected to the output terminal of the first inverter 41 and the first output terminal 46, respectively.

3) A seventh PMOS transistor P7 is provided whose drain potential is a reference potential VSS, and which has a gate and a source connected to the drain terminal of the first NMOS transistor N1 and the second output terminal 47, respectively.

4) An eighth PMOS transistor P8 is provided whose drain potential is a reference potential VSS, and which has a gate and a source connected to the drain terminal of the fifth NMOS transistor N4 and the first output terminal 46, respectively. Other construction is the same as the above first embodiment. Like legends are used to designate the same construction as the first embodiment and the details are omitted in order to avoid an overlapping explanation.

Next, operation of the differential signal output level converter circuit according to the third embodiment will be explained. when the potential level of the input signal is L level, output potential level of the first inverter 41 becomes the first power supply potential VDL. Therefore, the sixth NMOS transistor N6 becomes on. As a result, potential level of the first output terminal 46 becomes a second power supply potential VDH. Moreover, the second NMOS transistor N2 becomes on. Therefore, potential level of the second output terminal 47 becomes the reference potential VSS.

In this case, the third PMOS transistor P3 becomes off. Moreover, the fourth PMOS transistor P4 becomes on, and thereby, the second PMOS transistor P2 and the eighth PMOS transistor P8 become off. In addition, the output potential level of the second inverter 42 becomes the reference potential VSS. Therefore, the third NMOS transistor N3 and the fifth NMOS transistor N5 both become off. In addition, the forth NMOS transistor N4 become off. Whereby it is possible to prevent a flow-through current from flowing between an applied terminal of the second power supply potential VDH and an applied terminal of the reference potential VSS.

When the potential level of the input signal is H, each output potential level of the first inverter 41 and the second inverter 42 becomes the reference potential VSS and the first power supply potential VDL, respectively. Therefore, the third NMOS transistor N3 becomes on. As a result, potential level of the first output terminal 46 becomes the reference potential VSS. Moreover, the fifth NMOS transistor N5 also becomes on. Therefore, potential level of the second output terminal 47 becomes the second power supply potential VDH.

In this case, the third PMOS transistor P3 becomes on, and thereby, the first PMOS transistor P1 and the seventh PMOS transistor P7 become off. Further, the first NMOS transistor N1 becomes off. Furthermore, the fourth PMOS transistor P4 becomes off. Moreover, the second NMOS transistor N2 and the sixth NMOS transistor N6 become off. Whereby it is possible to prevent a flow-through current from flowing between an applied terminal of the second power supply potential VDH and an applied terminal of the reference potential VSS.

However, in this case, each threshold value of the fifth NMOS transistor N5 and the sixth NMOS transistor N6 exists in a range between the second power supply potential VDH and the first power supply potential VDL.

According to the third embodiment, the number of stages of logical element or transistor in a signal propagation path from the input terminal 40 to the output terminals 46 and 47 is two when the input signal is L level, and tree when the input signal is H level. Therefore, the number of stages is reduced as compared with the conventional case. As a result, the circuit scale is reduced, and the propagation delay time of the circuit itself becomes short. Moreover, the differential signal output level converter circuit has a simple construction as compared with the conventional circuit. Therefore, phase difference between differential signals becomes small. In addition, no flow-through current flows; therefore, it is possible to reduce a power consumption.

Accordingly, the differential signal output level converter circuit of the third embodiment can effectively be applicable to an LSI high speed input-output circuit, as an interface between internal and external buses such as a server or exchanger, as an interface circuit between an optical device for optical communication and an LSI, etc.

Figure 9:
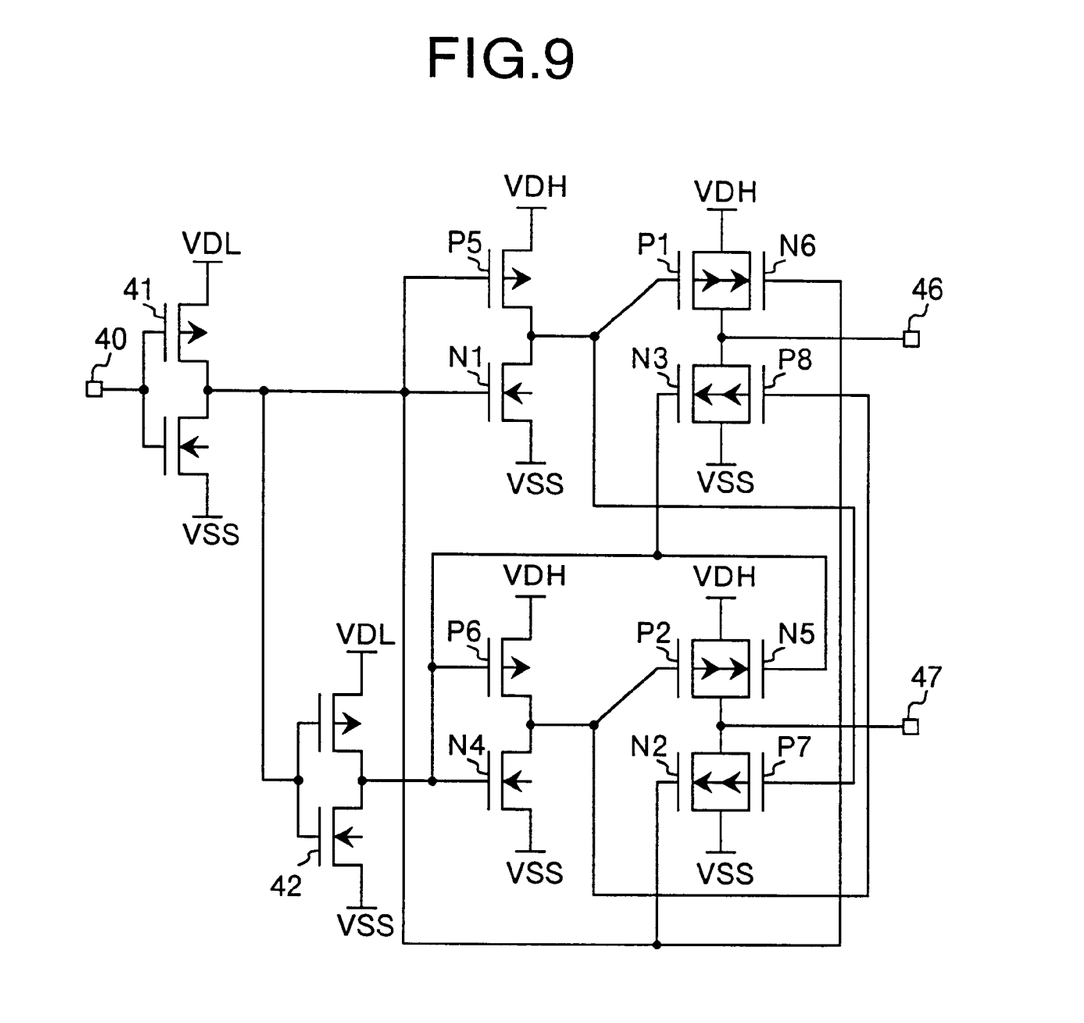
FIG. 9 is a circuit diagram showing an modification example of the third embodiment.

FIG. 9 shows a modification of the third embodiment. The relation between a differential signal output level converter circuit shown in FIG. 9 and the circuit shown in FIG. 8 is the same as the relation between the circuit of modification example shown in FIG. 5 and the circuit shown in FIG. 4 in the above first embodiment. More specifically, in place of the third PMOS transistor P3 and the fourth PMOS transistor P4, the circuit is provided with a fifth PMOS transistor P5 and a sixth PMOS transistor P6.

The circuit shown in FIG. 9 performs the same operation as the circuit shown in FIG. 8. However, in the differential signal output level converter circuit shown in FIG. 9, each output potential of the first output terminal 46 and the second output terminal 47 is not fed back to the pre-stage transistor. Therefore, the operating speed becomes speed as compared with the circuit shown in FIG. 8. Namely, the circuit shown in FIG. 9 is effectively applicable to a higher speed device.

As is evident from the above description, in the present invention, an insulating gate type filed effect transistor (MOS transistor) has been used as a field effect transistor. The present invention is not limited to this, and for example, a junction type field effect transistor may be used. Moreover, various designs and modifications may be made in a circuit configuration.

According to the present invention, the number of stages of logical element or transistor in a signal propagation path from the input terminal to the output terminals of the differential signal output level converter circuit is two or three when the input signal is L level, and three or four when the input signal is H level. Namely, it is possible to reduce the number of stages of logical element or transistor through which a signal goes, as compared with the conventional case. Therefore, a circuit scale can be made small, and thereby, it is possible to make short a propagation delay time of the circuit itself.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A level converter circuit comprising:
   an input terminal;
   a first output terminal and a second output terminal each of which outputs a differential signal;
   a logical element which outputs a reference potential or a first power supply potential based on the potential of the input signal received from said input terminal;
   a first N-channel field effect transistor which outputs the reference potential when said logical element has output the first power supply potential;
   a first P-channel field effect transistor which received the reference potential output by said first N-channel field effect transistor, and outputs a second power supply potential to said first output terminal;
   a second N-channel field effect transistor which outputs the reference potential to said second output terminal when said logical element has output the first power supply potential;
   a third N-channel field effect transistor which outputs the reference potential to said first output terminal when said logical element has output the reference potential;

a fourth N-channel field effect transistor which outputs the reference potential when said logical element has output the reference potential; and a second P-channel field effect transistor which receives the reference potential output by said fourth N-channel field effect transistor, and outputs the second power supply potential to said second output terminal.

2. The level converter circuit according to claim 1 further comprising:

a third P-channel field effect transistor having a gate, a source, and a drain, wherein the potential at said gate is the same as the output potential of said first output terminal, the potential at said source is the same as the second power supply potential, and said drain being commonly connected with a drain of said first N-channel field effect transistor.

3. The lever converter circuit according to claim 1 further comprising:

a fourth P-channel field effect transistor having a gate, a source, and a drain, wherein the potential at said gate is the same as the output potential of said second output terminal, the potential at said source is the same as the second power supply potential, and said drain being commonly connected with a drain of said fourth N-channel field effect transistor.

4. The level converter circuit according to claim 1 further comprising:

a fifth P-channel field effect transistor having a gate, a source, and a drain, wherein the potential at said gate is the same as the potential at a gate of said first N-channel field effect transistor, the potential at said source is the same as the second power supply potential, and said drain being commonly connected with a drain of said first N-channel field effect transistor.

5. The level converter circuit according to claim 1 further comprising:

a sixth P-channel field effect transistor having a gate, a source, and a drain, wherein the potential at said gate is the same as the potential at a gate of said fourth N-channel field effect transistor, the potential at said source is the same as the second power supply potential, and said drain being commonly connected with a drain of said fourth N-channel field effect transistor.

6. The lever converter circuit according to claim 1 further, wherein the level converter circuit further includes a seventh P-channel field effect transistor which outputs the reference potential to the second output terminal when an output potential of the logical element is the first power supply potential.

7. The level converter circuit according to claim 1 further, wherein the level converter circuit further includes a fifth N-channel field effect transistor which outputs the second power supply potential to the second output terminal when an output potential of the logical element is the reference potential.

8. The level converter circuit according to claim 1 further, wherein the level converter circuit further includes a sixth N-channel field effect transistor which outputs the second power supply potential to the first output terminal when an output potential of the logical element is the first power supply potential.

9. The level converter circuit according to claim 1 further, wherein the level converter circuit further includes an eighth P-channel field effect transistor which outputs the reference potential to the first output terminal when an output potential of the logical element is the reference potential.

10. The level converter circuit according to claim 1 further, wherein the logic element and each field effect transistor are mounted on the identical semiconductor substrate.

* * * * *